(12) United States Patent
Wadekar et al.

(10) Patent No.: US 11,863,170 B1
(45) Date of Patent: Jan. 2, 2024

(54) UNWANTED PEAK REDUCTION IN EQUALIZER

(71) Applicant: Synopsys, Inc., Sunnyvale, CA (US)

(72) Inventors: Jayesh Wadekar, Maharashtra (IN); Jairaj Naik K R, Karnataka (IN); Atul Kabra, Maharashtra (IN)

(73) Assignee: SYNOPSYS, INC., Sunnyvale, CA (US)

( * ) Notice: Subject to any disclaimer, the term of this patent is extended or adjusted under 35 U.S.C. 154(b) by 0 days.

(21) Appl. No.: 17/870,562

(22) Filed: Jul. 21, 2022

(51) Int. Cl.
*H03K 5/01* (2006.01)
*H03K 17/687* (2006.01)
*H04L 25/03* (2006.01)
*H04B 1/04* (2006.01)
*H04B 1/16* (2006.01)

(52) U.S. Cl.
CPC ..... *H03K 17/6872* (2013.01); *H03K 17/6874* (2013.01); *H04B 1/04* (2013.01); *H04B 1/16* (2013.01); *H04L 25/03343* (2013.01)

(58) Field of Classification Search
CPC ............ H03K 5/01; H03K 5/02; H03K 5/023; H03K 5/125; H03K 5/1252; H03K 17/687; H03K 17/6872; H03K 17/6874; H03F 1/26; H03F 1/30; H03F 1/301; H03F 3/005; H03F 3/45; H03F 3/45071; H03F 3/45179; H03F 3/45264; H03F 2200/372; H04L 25/03343; H04B 1/04; H04B 2001/0408; H04B 2001/0416; H04B 1/16
See application file for complete search history.

(56) References Cited

U.S. PATENT DOCUMENTS 10,419,250 B1 * 9/2019 Taylor ..................... H04L 27/01
2016/0294383 A1 * 10/2016 Rahman .............. H04L 25/0272

* cited by examiner

*Primary Examiner* — Long Nguyen
(74) *Attorney, Agent, or Firm* — Lewis Roca Rothgerber Christie LLP

(57) ABSTRACT

An equalizer circuit includes: a main stage circuit including: a main stage differential pair; and a main stage degeneration resistance; a replica stage circuit including: a replica stage differential pair matching the main stage differential pair; and a replica stage degeneration resistance matching the main stage degeneration resistance and disconnected from the replica stage differential pair; equalizer inputs connected to: gate electrodes of the main stage differential pair; and gate electrodes of the replica stage differential pair; and equalizer outputs connected to: a main stage positive output and a main stage negative output connected to drain electrodes of the main stage differential pair; and a replica stage positive output and a replica stage negative output connected to drain electrodes of the replica stage differential pair, the replica stage positive output connected to the main stage negative output and the replica stage negative output connected to the main stage positive output.

20 Claims, 8 Drawing Sheets

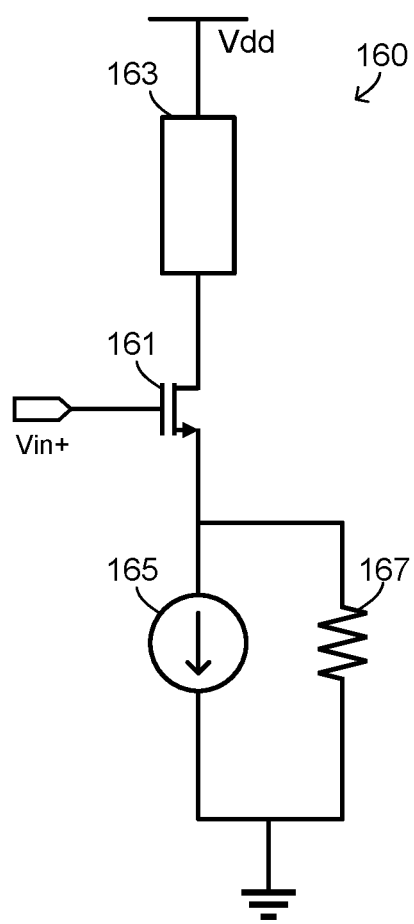 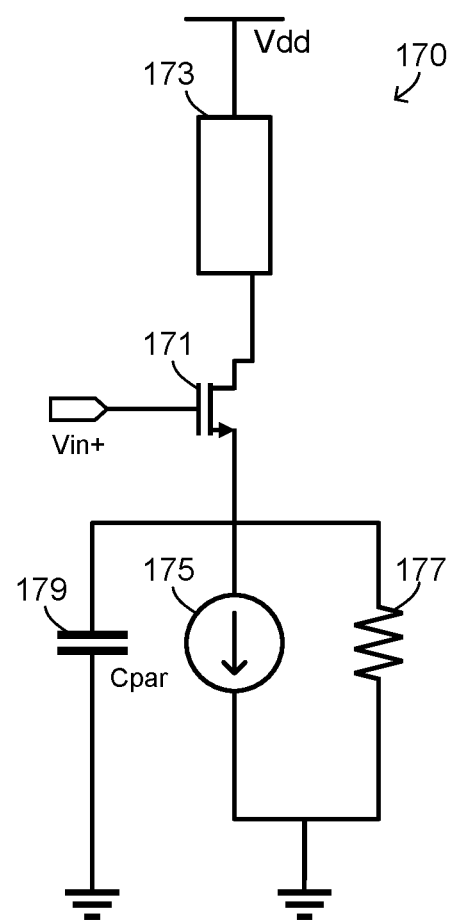
FIG. 1C  FIG. 1D

UNWANTED PEAK REDUCTION IN EQUALIZER

TECHNICAL FIELD

The present disclosure generally relates to an analog mixed signal circuit. In particular, the present disclosure relates to a system and method for reducing or canceling unwanted peaking effects in the frequency response of amplifiers.

BACKGROUND

A serializer/deserializer (SerDes) is a pair of functional blocks used in high speed communications. A serializer incorporated into a transmitter converts parallel data into serial data and therefore may also be referred to as a parallel-to-serial converter, where serialized data is transmitted over a communication channel. At a receiver connected to the communication channel, a deserializer converts the serial data back into parallel data and therefore may be referred to as a serial-to-parallel converter. When operating at high data rates, the transmitted serial data is distorted by the lossy communication channel, such as through frequency-dependent attenuation.

To address the distortion caused by the lossy communication channel, the transmitter and the receiver may each include equalizers. For example, the attenuation generally increases with frequency, and therefore the equalizers may generally "peak" (e.g., apply frequency-dependent amplification) the higher frequency content at the transmit side, the receive side, or both.

SUMMARY

According to one example of the present disclosure, an equalizer circuit includes: a main stage circuit including: a main stage differential pair including a first transistor and a second transistor; and a main stage degeneration resistance connected between a source electrode of the first transistor and a source electrode of the second transistor; a replica stage circuit including: a replica stage differential pair including a third transistor and a fourth transistor, the replica stage differential pair matching the main stage differential pair; and a replica stage degeneration resistance matching the main stage degeneration resistance and disconnected from the replica stage differential pair; a plurality of equalizer inputs connected to: a plurality of gate electrodes of the main stage differential pair; and a plurality of gate electrodes of the replica stage differential pair; and a plurality of equalizer outputs connected to: a plurality of main stage outputs, including a main stage positive output and a main stage negative output, connected to a plurality of drain electrodes of the main stage differential pair; and a plurality of replica stage outputs, including a replica stage positive output and a replica stage negative output, connected to a plurality of drain electrodes of the replica stage differential pair, the replica stage positive output being connected to the main stage negative output and the replica stage negative output being connected to the main stage positive output.

The plurality of equalizer inputs may include: a first equalizer input connected to: a gate electrode of the first transistor of the main stage differential pair; and a gate electrode of the fourth transistor of the replica stage differential pair; and a second equalizer input connected to: a gate electrode of the second transistor of the main stage differential pair; and a gate electrode of the third transistor of the replica stage differential pair.

The plurality of equalizer outputs may include: a first equalizer output connected to: a drain electrode of the first transistor of the main stage differential pair; and a drain electrode of the fourth transistor of the replica stage differential pair; and a second equalizer output connected to: a drain electrode of the second transistor of the main stage differential pair; and a drain electrode of the third transistor of the replica stage differential pair.

The equalizer circuit may have a configurable boost over a range of boost values, the range of boost values having a minimum value of 0 dB.

The main stage degeneration resistance may include a main stage resistor bank including a plurality of resistors and a plurality of switches, and the replica stage degeneration resistance may include a replica stage resistor bank including a plurality of resistors and a plurality of permanently disconnected switches.

The main stage circuit may further include a main stage capacitor bank including a plurality of capacitors and a plurality of switches, and the replica stage circuit may further include a replica stage capacitor bank including a plurality of capacitors and a plurality of permanently disconnected switches.

The first transistor and the second transistor of the main stage differential pair may be negative-type metal oxide semiconductor (NMOS) transistors, and the third transistor and the fourth transistor of the replica stage differential pair may be NMOS transistors.

The main stage circuit may further include: a second main stage differential pair including a first positive-type metal oxide semiconductor (PMOS) transistor and a second PMOS transistor connected between the main stage differential pair and a voltage source, and the replica stage circuit may further include: a second replica stage differential pair including a first PMOS transistor and a second PMOS transistor connected between the replica stage differential pair and the voltage source.

According to one example of the present disclosure, a communications integrated circuit includes: an equalizer circuit connected to a port of the communications integrated circuit, the equalizer circuit including: a main stage circuit including: a main stage differential pair including a first transistor and a second transistor; and a main stage degeneration resistance connected between a source electrode of the first transistor and a source electrode of the second transistor; a replica stage circuit including: a replica stage differential pair including a third transistor and a fourth transistor, the replica stage differential pair matching the main stage differential pair, the replica stage circuit having a parasitic capacitance matching a parasitic capacitance of the main stage circuit; a plurality of equalizer inputs connected to: a plurality of gate electrodes of the main stage differential pair; and a plurality of gate electrodes of the replica stage differential pair; and a plurality of equalizer outputs connected to: a plurality of main stage outputs, including a main stage positive output and a main stage negative output, connected to a plurality of drain electrodes of the main stage differential pair; and a plurality of replica stage outputs, including a replica stage positive output and a replica stage negative output, connected to a plurality of drain electrodes of the replica stage differential pair, the replica stage positive output being connected to the main stage negative output and the replica stage negative output being connected to the main stage positive output.

The port of the communications integrated circuit may be a receive port connected to the plurality of equalizer inputs.

The plurality of equalizer inputs may include: a first equalizer input connected to: a gate electrode of the first transistor of the main stage differential pair; and a gate electrode of the fourth transistor of the replica stage differential pair; and a second equalizer input connected to: a gate electrode of the second transistor of the main stage differential pair; and a gate electrode of the third transistor of the replica stage differential pair.

The port of the communications integrated circuit may be a transmit port connected to the plurality of equalizer outputs.

The plurality of equalizer outputs may include: a first equalizer output connected to: a drain electrode of the first transistor of the main stage differential pair; and a drain electrode of the fourth transistor of the replica stage differential pair; and a second equalizer output connected to: a drain electrode of the second transistor of the main stage differential pair; and a drain electrode of the third transistor of the replica stage differential pair.

The equalizer circuit may have a configurable boost over a range of boost values, the range of boost values having a minimum value of 0 dB.

The main stage degeneration resistance may include a main stage resistor bank including a plurality of resistors and a plurality of switches, and the replica stage circuit may include a replica stage degeneration resistance including a replica stage resistor bank including a plurality of resistors and a plurality of permanently disconnected switches.

According to one example of the present disclosure, a non-transitory computer-readable medium includes stored instructions, which when executed by a processor, cause the processor to generate a digital representation of an integrated circuit including: a main stage circuit including: a main stage differential pair including a first transistor and a second transistor; and a main stage degeneration resistance connected between a source electrode of the first transistor and a source electrode of the second transistor; a replica stage circuit including: a replica stage differential pair including a third transistor and a fourth transistor, the replica stage differential pair matching the main stage differential pair; and a replica stage degeneration resistance matching the main stage degeneration resistance and disconnected from the replica stage differential pair; a plurality of equalizer inputs connected to: a plurality of gate electrodes of the main stage differential pair; and a plurality of gate electrodes of the replica stage differential pair; and a plurality of equalizer outputs connected to: a plurality of main stage outputs, including a main stage positive output and a main stage negative output, connected to a plurality of drain electrodes of the main stage differential pair; and a plurality of replica stage outputs, including a replica stage positive output and a replica stage negative output, connected to a plurality of drain electrodes of the replica stage differential pair, the replica stage positive output being connected to the main stage negative output and the replica stage negative output being connected to the main stage positive output.

The main stage circuit may have a configurable boost over a range of boost values, the range of boost values having a minimum value of 0 dB.

The main stage degeneration resistance may include a main stage resistor bank including a plurality of resistors and a plurality of switches, and the replica stage degeneration resistance may include a replica stage resistor bank including a plurality of resistors and a plurality of permanently disconnected switches.

The main stage circuit may further include a main stage capacitor bank including a plurality of capacitors and a plurality of switches, and the replica stage circuit may further include a replica stage capacitor bank including a plurality of capacitors and a plurality of permanently disconnected switches.

The first transistor and the second transistor of the main stage differential pair and the third transistor and the fourth transistor of the replica stage differential pair may be negative-type metal oxide semiconductor (NMOS) transistors, and the main stage circuit may further include: a second main stage differential pair including a first positive-type metal oxide semiconductor (PMOS) transistor and a second PMOS transistor connected between the main stage differential pair and a voltage source, and the replica stage circuit may further include: a second replica stage differential pair including a third PMOS transistor and a fourth PMOS transistor connected between the replica stage differential pair and the voltage source.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 1C depicts an analog amplifier with resistance R in the degeneration.

FIG. 1D depicts an analog amplifier with resistance R in the degeneration and explicitly showing parasitic capacitance at the degeneration.

DETAILED DESCRIPTION

Aspects of the present disclosure relate to unwanted peak reduction in equalizers.

In some communication systems, such as Ethernet networking communication, high speed digital data is transmitted over differential pairs of wires. Differential pairs of wires present a communication channel in which the signal loss or attenuation increases as the frequency of the signal increases. A serializer/deserializer (SerDes) pair includes a serializer located at the transmitter and a deserializer located at the receiver, where the serializer converts parallel data into serial data for transmission over the communication channel (e.g., over the differential pair of wires) and the deserializer converts the serial data back into parallel data at the receiver.

An equalizer compensates for distortions introduced by the communication channel. In particular, a SerDes includes an equalizer (or separate equalizers at the transmitter and at the receiver) to boost (or amplify) the signal in a frequency-dependent manner, where higher frequency signals are boosted or amplified more than lower frequency signals. As a result, under ideal circumstances, the equalizer perfectly compensates for the frequency-dependent attenuation caused by the communication channel. In other words, assuming a perfect equalizer, the combination of the communication channel and the equalizer has a uniform or flat frequency response (equalized or uniform).

In practice, the magnitude of the frequency-dependent loss or attenuation depends on the length of the channel (e.g., the length of the wires), where longer channels result in higher loss or greater attenuation. Therefore, in order for the equalizer to be able to support a wide range of operating conditions (e.g., different network cable lengths) the equalizer may be be programmable or tunable to match the particular frequency-dependent attenuation caused by the communication channel. As a specific example, a tunable equalizer can provide a different boost to higher frequency signals depending on the length of the network cable plugged into a network device that includes the serializer or deserializer.

Figure 1A:
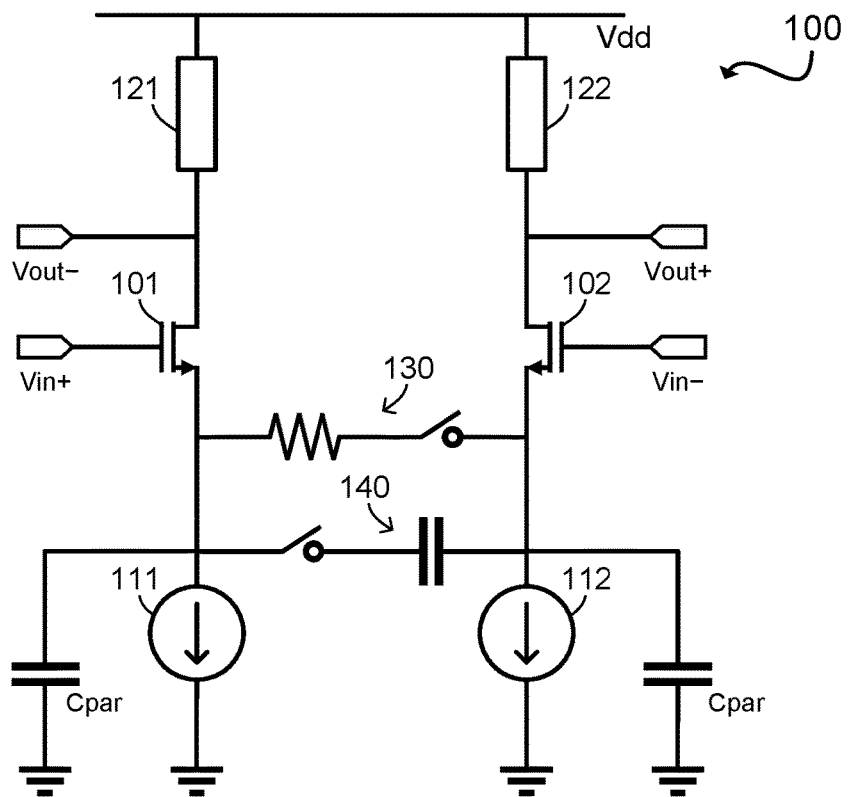
FIG. 1A is circuit diagram illustrating one example of an equalizer that may be included in a SerDes.

FIG. 1A is circuit diagram illustrating one example of an equalizer that may be included in a SerDes. In the example shown in FIG. 1A, a first negative (n)-type metal oxide semiconductor field effect transistor (NMOS) transistor 101 and a second NMOS transistor 102 form a differential pair. While the example shown in FIG. 1A uses NMOS transistors in the differential pair, the disclosure is not limited thereto and may similarly be implemented using positive (p)-type metal oxide semiconductor field effect transistors (PMOS) or other types of transistors such as bipolar junction transistors (BJT) and junction-gate field-effect transistors (JFET). The gate electrodes of the first NMOS transistor 101 and the second NMOS transistor 102 are connected to respective equalizer inputs to the equalizer 100, including a non-inverting input labeled Vin+ and an inverting input Vin− (or vinp and vinm), and correspond to the differential pair of wires that transmit the signal that is to be equalized by the equalizer 100. Each NMOS transistor is connected with a corresponding current source (first current source 111 and second current source 112) at the source electrode of the NMOS transistor and a corresponding load (first load 121 and second load 122) at the drain electrode of the NMOS transistor, where the load, the NMOS transistor, and the current source are connected in series between a voltage source (Vdd) and ground.

A degeneration resistance 130 (represented by a single resistor with a switch) is connected between the source electrodes of the NMOS transistors 101 and 102 (resistive degeneration) to set the gain or boost of the equalizer 100. The degeneration resistance 130 may include a resistor bank that includes, for example, a plurality of resistors connected in parallel, where the switches may connect or disconnect particular resistors to the source electrodes of the NMOS transistors 101 and 102, thereby allowing the resistance between the source electrodes of the NMOS transistors 101 and 102 to be varied in accordance with the setting of the switches. Likewise, a degeneration capacitance 140 (represented by a capacitor with a switch) is also connected between the source electrodes of the NMOS transistors (capacitive degeneration) to set the shape of the peaking effect (e.g., the frequency-dependent boost of the equalizer 100). The capacitor bank may similarly include a plurality of capacitors arranged in parallel, such that individual capacitors can be connected or disconnected to the source electrodes of the NMOS transistors to vary the capacitance between the source electrodes. As such, by selecting different combinations of resistors and capacitors in the degeneration resistance 130 and the degeneration capacitance 140, the equalizer 100 can be programmed or configured to various boost settings or equalization settings. For channels which require no equalization, the degeneration capacitance 140 is turned off (e.g., by disconnecting the capacitance using the switch).

The output of the equalizer 100 is read from the drain electrodes of the NMOS transistors as a pair of voltage signals—a negative output signal Vout− (or voutm) and a positive output signal Vout+ (or voutp).

Figure 1B:
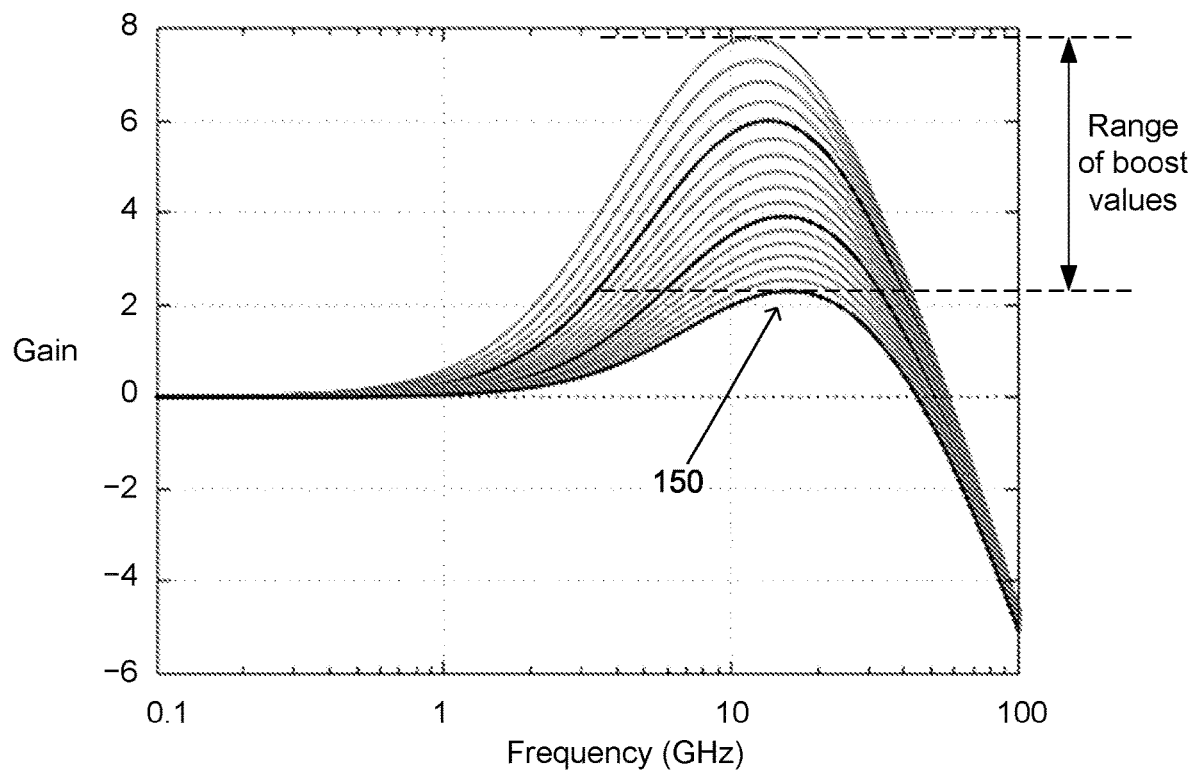
FIG. 1B is a graph depicting the frequency-dependent boosts provided by an equalizer at a plurality of different boost settings.

FIG. 1B is a graph depicting the frequency-dependent boosts provided by an equalizer at a plurality of different boost settings (or equalization settings), where each curve corresponds to a different setting. As shown in FIG. 1B, the equalizer provides substantially no boost (e.g., zero gain) at low frequencies (e.g., below about 1 GHz) and steadily increases the boost with increasing frequency of input signals, with a peak at about 20 GHz, and quickly decreasing boost after the peak.

While some comparative equalizer circuits such as that shown in FIG. 1A can provide 15 dB or more boost, these equalizer circuits cannot be tuned to a low value such as 0 dB (no boost gain) due to parasitic capacitances arising from current sources, switches used to program the degeneration capacitors, and metal routing. The parasitic capacitances is represented in FIG. 1A by aggregated parasitic capacitance values Cpar. As shown in FIG. 1B, even at the lowest boost setting (with the degeneration capacitance 140 disconnected) indicated at the parasitic capacitance Cpar causes a non-zero boost or unwanted peak 150 at 20 GHz, such that the range of boost values at about 20 GHz, as shown in FIG. 1B, is between about 2 to 8.

As a more general explanation of this phenomenon, FIG. 1C depicts an analog amplifier 160 with resistance R in the degeneration. As shown in FIG. 1C, an input signal (Vin+) to the amplifier is applied to the gate electrode of an NMOS transistor 161. The drain electrode of the NMOS transistor 161 is connected to a voltage source Vdd through a load 163. The source electrode of the NMOS transistor 161 may be referred to as the degeneration node (or degeneration) of the NMOS transistor 161. A current source 165 is connected in parallel with the resistance R 167 between the degeneration node and ground.

The effective transconductance (Gm) of this analog amplifier 160 is given by:

$$Gm = \frac{gm}{1 + gm \cdot R}$$

where gm is the transconductance of the NMOS transistor 161.

However, the circuit shown in FIG. 1C does not account for parasitic capacitance arising from the physical structure of the circuit (e.g., due to the current source 165 and due to metal routing).

FIG. 1D depicts an analog amplifier with resistance R in the degeneration and explicitly showing parasitic capacitance Cpar at the degeneration node. As shown in FIG. 1D, an input signal (Vinp) to the amplifier is applied to the gate electrode of an NMOS transistor 171. The drain electrode of the NMOS transistor 171 is connected to a voltage source Vdd through a load 173. The source electrode of the NMOS transistor 171 may be referred to as the degeneration node (or degeneration) of the NMOS transistor 171. A current source 175 is connected in parallel with the resistance R 177 between the degeneration node and ground. The parasitic capacitance Cpar of the circuit is collectively shown as capacitance C 179, connected between the degeneration node and ground.

In the presence of this parasitic capacitance C, the effective transconductance is:

$$Gm = \frac{gm(1 + R \cdot j\omega C)}{1 + gm \cdot R + R \cdot j\omega C}$$

where j represents the imaginary unit $\sqrt{-1}$, $\omega$ is the frequency of the signal, and gm is the transconductance of the NMOS transistor 171. The additional pole-zero pair arising from the parasitic degeneration capacitor 179 causes a peaking in the frequency response of the amplifier 170.

Therefore, referring back to FIG. 1A and FIG. 1B, the parasitic capacitance Cpar limits the programmable range of boost values of this equalizer and therefore limits the range of channels (e.g., frequencies) and channel lengths that can be supported by a receiver in a communication system due to the equalizer being unable to correctly compensate for the distortion introduced by the channel. For example, this unwanted peaking can over equalize (e.g., boost portions of the signal that do not need to be boosted), thereby leading to signal distortion, which is contrary to the desired goal of using the equalizer to remove distortion.

Therefore, aspects of the present disclosure relate to an equalizer circuit that can be tuned to low boost values such as 0 dB, which is especially helpful in the case of short reach channels (e.g., shorter cables having less attenuation). In more detail, an equalizer circuit according to the present disclosure includes a main transconductance (gm) cell that provides the programmable boost to higher frequency signals and an additional gm cell or replica gm cell that is a substantial replica of the main gm cell, but with capacitive degeneration in the opposite direction as the main gm cell. As a result, by adding the output of the main gm cell (the main stage output) and the output of the additional gm cell (the replica stage output), only high frequency gain is attenuated and therefore the low frequency gain of the entire equalizer is maintained at a low boost value such as 0 dB.

In more detail, in some examples of the present disclosure, the additional gm cell (or arm) is substantially identical to the main gm cell. The capacitive degeneration present in the additional gm cell is fixed at a minimum value to cancel the peaking that arises from the parasitic capacitance of the main gm cell. For longer channels (e.g., longer wires), the degeneration capacitor in the main gm cell is switched to a higher value while keeping the capacitance in the additional gm cell at the minimum setting.

Accordingly, an equalizer circuit according to the present disclosure can provide a wider range of boost values such that it is suitable for use with a wider range of channels (e.g., different frequencies and different reach of the channels or different lengths of the differential wires).

Technical advantages of the present disclosure include, but are not limited to, cancelling high frequency unwanted peaking that arises from only parasitic capacitance, thereby attaining flat frequency response for a minimum boost setting. This makes it possible to use a minimum boost setting for very low loss channels (e.g., very short reach channels or short network cables).

An equalizer that can provide a full range of boost values or boost settings from 0 dB (or a substantially flat response over the working frequency range) to a high boost (e.g., 15 dB) provides a technical advantage in that it allows the same equalizer design to be used in a wide range of use cases. For example, the same equalizer circuit can be used to equalize long reach channels (e.g., network cables extending across a data center or between buildings) as well as short reach channels (e.g., network cables connecting between devices on a same physical rack).

As such, an equalizer circuit according to the present disclosure can replace multiple different equalizer designs that are tailored for different specific use cases (e.g., different equalizer circuits for different channel lengths) or different communications hardware (e.g., different ports on a network switch) that are tailored for specific use cases (e.g., long reach connections versus short reach connections through the inclusion of an equalizer or exclusion of an equalizer, respectively). Accordingly, another advantage of the wide boost range of an equalizer according to the present disclosure is the reduction in the number of different integrated circuits that need to be produced for different use cases, thereby reducing waste and reducing planning requirements (e.g., avoiding having to forecast which particular equalizer designs will be in higher demand) and also increasing flexibility in the design of communication systems (e.g., allowing the same ports on communication devices such as network switches and routers to be used for short reach channels as well as long reach channels).

Another technical advantage is that the use of the additional gm cell or replica cell can be leveraged to cancel high frequency noise in the input signal.

A further technical advantage of the present disclosure is that comparative techniques for reducing peaking result in a trade-off involving degradation of gain bandwidth product or where the comparative equalizer does not work well across process corners. In particular, such comparative techniques require tedious analog simulations because these techniques are very sensitive to semiconductor manufacturing process variations. In contrast, the present disclosure a circuit design that provides an equalizer that works well across different process corners, without requiring extensive analog simulation.

Figure 2:
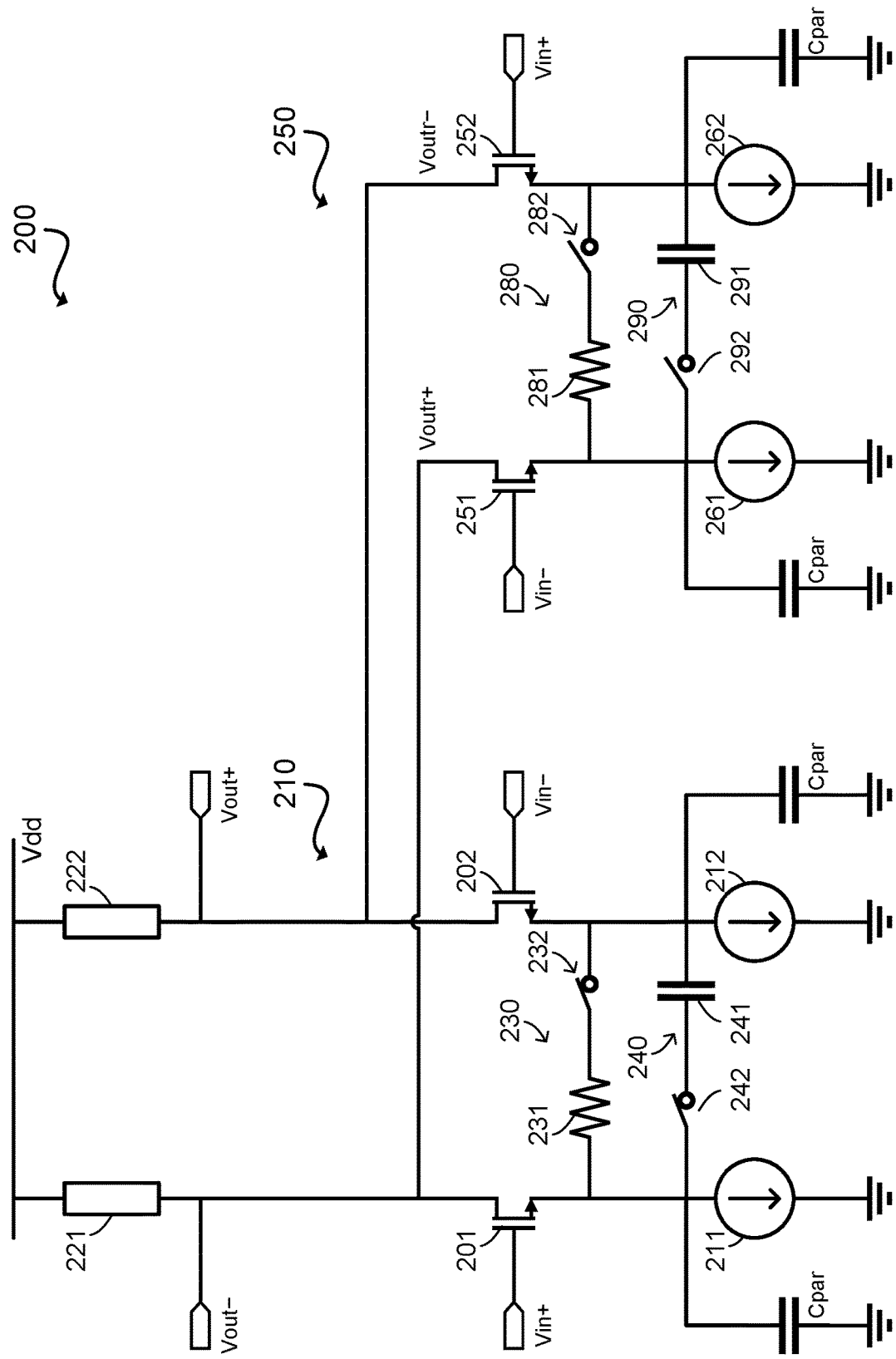
FIG. 2 is circuit diagram illustrating one example of an equalizer according to the present disclosure that reduces unwanted peaking.

FIG. 2 is circuit diagram illustrating one example of an equalizer circuit 200 according to the present disclosure that reduces unwanted peaking. As shown in FIG. 2, an equalizer circuit 200 according to the present disclosure includes a main transconductance (gm) cell 210 (or main stage) and an additional or replica gm cell 250 (or replica stage).

The main gm cell or main stage 210 is substantially similar to the equalizer circuit shown in FIG. 1A. In the example of the present disclosure shown in FIG. 2, the main stage 210 includes a first NMOS transistor 201 and a second NMOS transistor 202 that form a main stage differential pair. The gate electrodes of the first NMOS transistor 201 and the second NMOS transistor 202 are connected to respective equalizer inputs to the equalizer, including a non-inverting input Vin+ and an inverting input Vin− (or vinp and vinm), and correspond to the differential pair of wires that transmit the signal that is to be equalized by the equalizer circuit 200. Each NMOS transistor is connected with a corresponding current source (first current source 211 and second current source 212) at the source electrode of the NMOS transistor and a corresponding load (first load 221 and second load 222) at the drain electrode of the NMOS transistor, where the load, the NMOS transistor, and the current source are connected in series between a voltage source (Vdd) and ground. A main stage degeneration resistance 230 (represented by a single resistor 231 with a switch 232) is connected between the source electrodes of the NMOS transistors (resistive degeneration) to set the gain or boost of the equalizer circuit 200. The main stage degeneration resistance 230 may be implemented as a resistor bank 231 that includes, for example, a plurality of resistors connected in parallel, where the switches 232 may connect or disconnect particular resistors to the source electrodes of the NMOS transistors, thereby allowing the resistance between the source electrodes of the NMOS transistors to be varied in accordance with the setting of the switches. Alternatively, the main stage degeneration resistance 230 may be implemented with a fixed resistor (e.g., a fixed resistance). Likewise, a main stage degeneration capacitance 240 (represented by a capacitor 241 with a switch 242) is also connected between the source electrodes of the NMOS transistors (capacitive degeneration) to set the shape of the peaking effect (e.g., the frequency-dependent boost of the equalizer circuit 200). The main stage degeneration capacitance 240 may be implemented as a capacitor bank 241 that includes a plurality of capacitors arranged in parallel, such that individual capacitors can be connected or disconnected to the source electrodes of the NMOS transistors by switches 242 to vary the capacitance between the source electrodes. As such, by selecting different combinations of main stage degeneration resistance 230 and main stage degeneration capacitance 240, the equalizer circuit 200 can be programmed or configured to various equalization settings. For channels which require no equalization, the main stage degeneration capacitance 240 is turned off (e.g., the capacitors of a capacitor bank are disconnected). As shown in FIG. 2, in a manner similar to that of the equalizer shown in FIG. 1A, the various components of the main stage 210 of the equalizer circuit 200 result in a parasitic capacitance, as represented by parasitic capacitors Cpar connected to the degeneration nodes of the first NMOS transistor 201 and the second NMOS transistor 202.

The output of the main stage 210 (the main stage output) of the equalizer circuit 200 is read from the drain electrodes of the first NMOS transistor 201 and the second NMOS transistor 202 of the main stage 210, where the main stage output is connected to the output of equalizer circuit 200 as a whole, represented as a pair of signals—a main stage negative output signal Vout− (or voutm) and a main stage positive output signal Vout+ (or voutp).

In order to counteract the effect of the parasitic capacitance, the output of the replica gm cell or replica stage 250 (the replica stage output) is connected to the output of the equalizer circuit 200 as a whole (the equalizer output) in an opposite direction from the main stage output. In the example shown in FIG. 2, a replica stage negative output Voutr− is connected to the main stage positive output Vout+ and a replica stage positive output Voutr+ is connected to the main stage negative output Vout− such that the replica stage output cancels out the unwanted peaking in the signal in the main stage output. The replica stage 250 includes a plurality of circuit elements that are substantially identical to corresponding circuit elements of the main stage 210, including a replica stage differential pair including a first NMOS transistor 251 and a second NMOS transistor 252, a first current source 261, a second current source 262, a replica stage degeneration resistance 280, and a replica stage degeneration capacitance 290.

In some examples according to the present disclosure, the dimensions of the circuit elements, such as the lengths and widths of the NMOS transistors and transistors of the current sources, the number of resistors in the resistor bank, the dimensions of the capacitors in the capacitor bank, the dimensions of the switches, the lengths and shapes of the metal wires or other connections between circuit elements, and the like, all match or are substantially the same as those of the main stage 210 and the replica stage 250, such that the parasitic capacitance present in the replica stage 250 is substantially the same as the parasitic capacitance present in the main stage 210. One difference between the main stage 210 and the replica stage is that, in replica stage 250, the degeneration capacitance and resistance are both permanently disconnected from the circuit (e.g., the switches 282 of a resistor bank of the replica stage degeneration resistance 280 and the switches 292 of a capacitor bank of the replica stage degeneration capacitance 290 are permanently kept open or disconnected or where dummy connections are formed between the degeneration nodes of the first NMOS transistor 251 and the second NMOS transistor 252 and the replica stage degeneration resistance 280 and replica stage degeneration capacitance 290, where the dummy connections of the switches 282 and 292 are permanently open and do not form a conductive path between the degeneration nodes through the degeneration resistance or the degeneration capacitance). As a result, the shape of the peak of the boost provided by the replica stage 250 represents only the influence of the parasitic capacitance, that is, the unwanted peaking at high frequency. As noted above, the replica stage degeneration resistance 280 and the replica stage degeneration capacitance 290, including their respective switches 282 and 292, are both physically formed in the circuit, even though they are permanently disconnected (e.g., where the switches 282 and 292 are permanently open), such that their contributions to the parasitic capacitance also appear in the replica.

As noted above, the outputs Voutr+ and Voutr− of the replica stage 250 (the replica stage output) are connected in reverse or in an opposite direction from the main stage 210, where the replica stage positive output Voutr+ is connected to the main stage negative output Vout− and the replica stage negative output Voutr− is connected to the main stage positive output Vout+. The output of the equalizer circuit 200 (the equalizer output) is read from the drain electrodes of the transistors as a pair of signals—a negative output signal Vout− (or voutm) and a positive output signal Vout+ (or voutp). As shown in FIG. 2, the source electrode of the first NMOS transistor 251 supplied with the positive or non-inverting equalizer input Vin+ of the replica stage 250 is connected to the source electrode of the second NMOS transistor 202 supplied with the negative or inverting equalizer input Vin− of the main stage 210 in order to generate the positive output signal Vout+ of the equalizer circuit 200. Likewise, as shown in FIG. 2, the source electrode of the second NMOS transistor 252 supplied with the inverting equalizer input Vin− of the replica stage 250 is connected to the source electrode of the first NMOS transistor 201 supplied with the non-inverting equalizer input Vin+ of the main stage 210 in order to generate the negative output signal Vout− of the equalizer circuit 200. As a result, the high frequency current flowing in the replica is subtracted from the current of the main stage, thereby leading to high frequency cancellation. This high frequency current is a strong function of the parasitic capacitance in the degeneration node. In addition, because there is no degeneration resistance in the replica (e.g., the replica stage degeneration resistance 280 is permanently disconnected from the replica stage 250), there is no DC gain cancellation (e.g., no reduction in the gain of the overall equalizer circuit 200 for low frequency signals).

In more detail, the total output current I is the sum of a first output current $I_1$ flowing through the first load 221 and a second output current $I_2$ flowing through the second load 222:

$$I = I_1 + I_2$$

where $I_1 = Gm_{main} \cdot vinp$ and $I_2 = Gm_{replica} \cdot vinm$

Defining Vin=vinp=−vinm, then:

$$I = Vin \cdot (Gm_{main} - Gm_{replica})$$

$$Gm_{main} = \frac{gm(1 + R \cdot j\omega C)}{1 + gm \cdot R + R \cdot j\omega C}$$

$$Gm_{replica} = \frac{gm(j\omega C)}{gm + j\omega C}$$

where j represents the imaginary unit $\sqrt{-1}$, ω is the frequency of the signal, C is the parasitic capacitance, and gm is the transconductance of the NMOS transistors (assumed to be substantially the same by virtue of being a replica, e.g., where the NMOS transistors are formed with the same dimensions on the same semiconductor substrate). For the sake of simplicity, the capacitance contributed by the main stage degeneration capacitance 240 is omitted from the analysis herein. Accordingly, the output current I can be computed as follows:

$$I = Vin \cdot \frac{gm}{(gm + j\omega RC)(gm + j\omega C)}$$

Therefore, the replica stage 250 reduces or removes the unwanted peak (or unwanted frequency dependence) arising from the parasitic capacitance. When the main stage degeneration capacitance 240 is connected, a desired frequency dependence or peak is introduced into the output current I in accordance with the capacitance value of the main stage degeneration capacitance 240.

Figure 3:
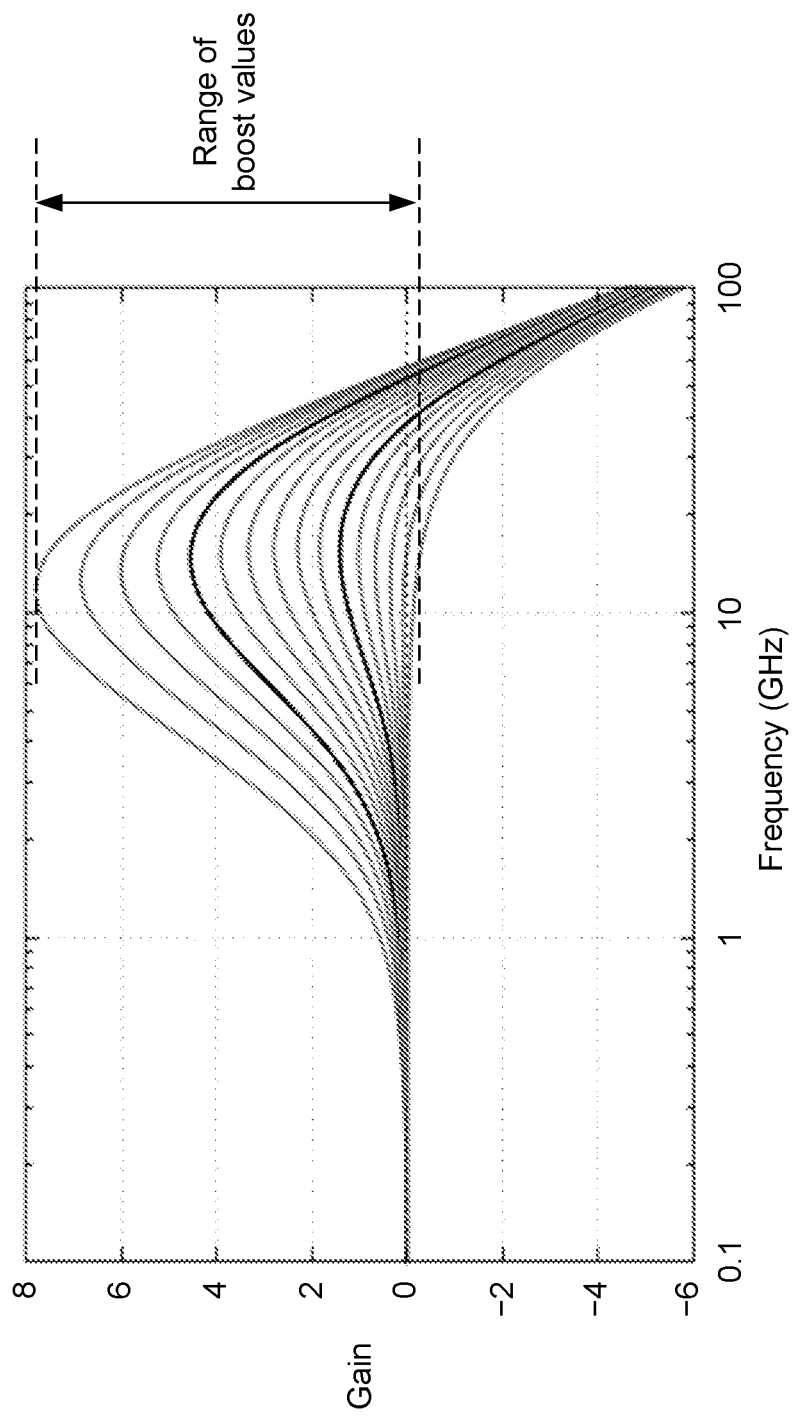
FIG. 3 is a graph depicting the frequency-dependent boosts provided by an equalizer at a plurality of different boost settings according to one example of the present disclosure.

FIG. 3 is a graph depicting the frequency-dependent boosts provided by an equalizer at a plurality of different boost settings according to one example of the present disclosure. As shown in FIG. 3, the unwanted peaking of the main stage 210 arising from the parasitic capacitance is cancelled by the opposite peaking of the replica stage 250 to achieve flat response while keeping direct current (DC) gain (e.g., low frequency gain) unchanged.

For example, at zero boost setting, shown by the lowest line in FIG. 3, the boost remains flat through to about 20 GHz, in contrast to the lowest line of FIG. 1B, which shows an unwanted peak at about 20 GHz. In addition, for high boost setting, when the main stage degeneration capacitance 240 is set to max value, the replica stage degeneration capacitance 290 is still kept off (e.g., the switch of the capacitor bank of the replica stage degeneration capacitance 290 is disconnected), so that the equalizer circuit 200 continues to provide a high frequency boost from the main stage 210 from its main stage degeneration capacitance 240. Therefore, the required boost (e.g., for long reach channels) remains intact, as shown by other lines (e.g., the topmost curve) in FIG. 3.

Because the equalizer circuit 200 shown in FIG. 2 can achieve flat as well as boosted frequency responses, the same circuit can be programmed to provide a wider range of possible boost values than the equalizer shown in FIG. 1A, including 0 dB boost over an entire working frequency range up to, for example, about 20 GHz, as shown in FIG. 3. Therefore, an equalizer according to examples of the present disclosure can be programmed work across wide range of channels, including short reach channels that do not require equalization or that require only small amounts of equalization (e.g., small amounts of boost at high frequencies). As noted above, an equalizer circuit may be implemented at the transmitter or transmit side and/or at the receiver or receive side of a communication channel. For example, in the case of an equalizer circuit implemented on the transmit side of the communication channel, the equalizer output would be connected to a differential pair of the communication channel (e.g., possibly through additional analog amplifier stages) through which the transmitter transmits data signals. In the case of an equalizer implemented in an integrated circuit on the receive side of the communication channel, the equalizer input would be connected to a differential pair of the communication channel (e.g., possibly through additional analog amplifier stages) through a receive port of the integrated circuit through which the integrated circuit receives data signals. The integrated circuit may be a communications integrated circuit that includes additional functionality, such as analog amplifier stages, a digital-to-analog converter (DAC), an analog-to-digital converter (ADC), an encoder, a decoder, and the like.

While FIG. 2 depicts some examples of equalizer circuits 200 according to the present disclosure, embodiments are not limited thereto and may also include other arrangements.

Figure 4:
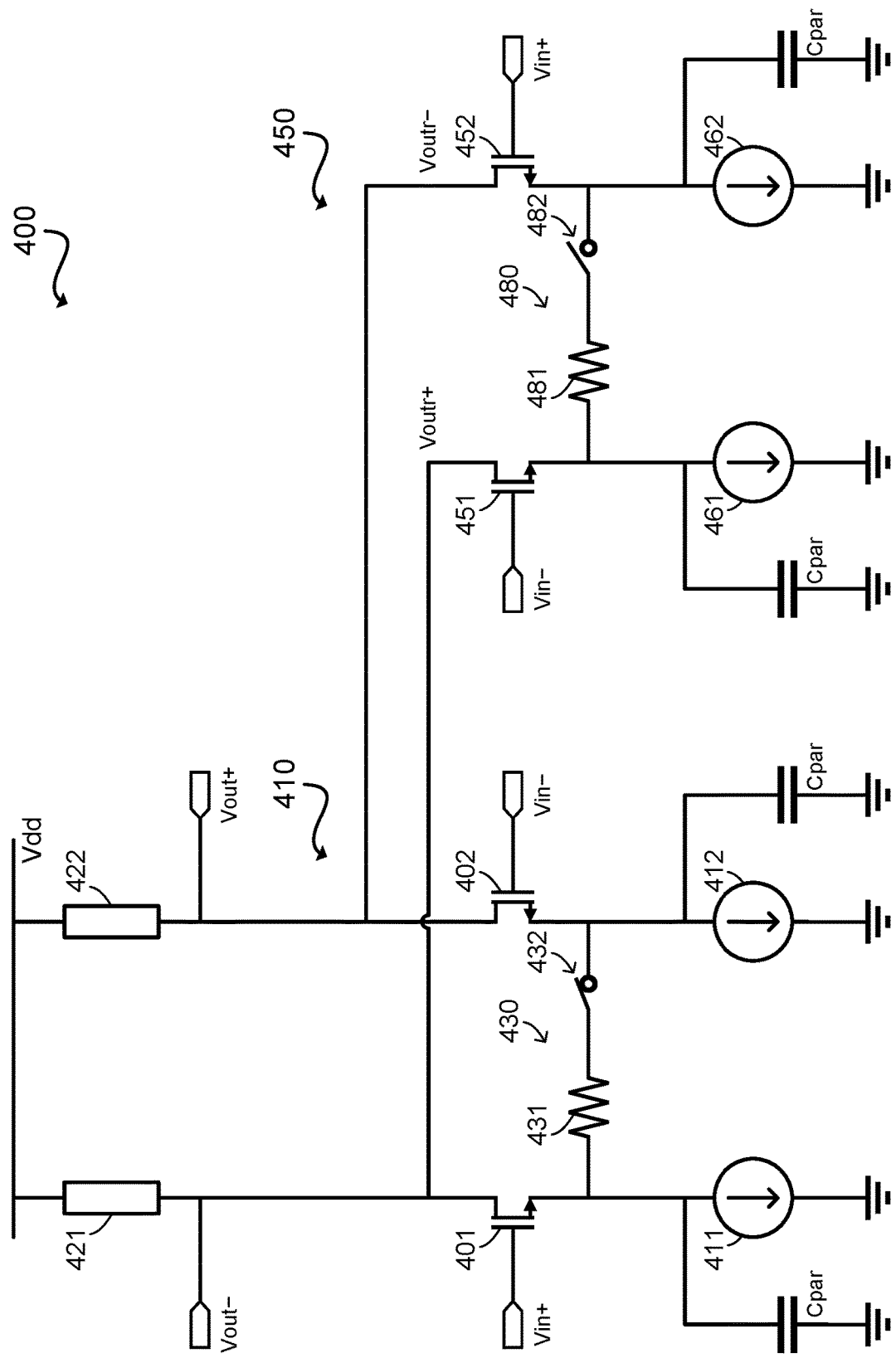
FIG. 4 is a circuit diagram of an equalizer circuit according to one example of the present disclosure.

FIG. 4 is a circuit diagram of an equalizer circuit 400 according to one example of the present disclosure. The equalizer circuit 400 is substantially similar to the equalizer circuit 200 but omits the capacitor bank from both the main stage 410 and the replica stage 450. For example, an equalizer circuit 400 shown in FIG. 4 would consume less area in an integrated circuit than the equalizer circuit 200 shown in FIG. 2, and may be useful in circumstances where the frequency of the peak may be set by the parasitic capacitance and/or by an additional, fixed degeneration capacitance in accordance with a known frequency-dependent distortion of a communication channel, while retaining adaptability to set different levels of boost according to the length of the communication channel using a main stage degeneration resistance 430 including a resistor bank including a plurality of resistors 431 with a plurality of switches 432 (represented in FIG. 4 by a single resistor and a single switch) such that the resistance value of the main stage degeneration resistance 430 can be programmed or set by toggling the switches 432 on or off.

In more detail, in the example of the present disclosure shown in FIG. 4, the main stage 410 includes a first NMOS transistor 401 and a second NMOS transistor 402 that form a main stage differential pair. The gate electrodes of the first NMOS transistor 401 and the second NMOS transistor 402 are connected to respective equalizer inputs to the equalizer, labeled Vin+ and Vin− (or vinp and vinm), respectively and correspond to the differential pair of wires that transmit the signal that is to be equalized by the equalizer circuit 400. Each NMOS transistor is connected with a corresponding current source (first current source 411 and second current source 412) at the source electrode of the NMOS transistor and a corresponding load (first load 421 and second load 422) at the drain electrode of the NMOS transistor, where the load, the NMOS transistor, and the current source are connected in series between a voltage source (Vdd) and ground. A main stage degeneration resistance 430 (represented by a single resistor 431 with a switch 432) is connected between the source electrodes of the NMOS transistors (resistive degeneration) to set the gain or boost of the equalizer circuit 400. The main stage degeneration resistance 430 may include a resistor bank including, for example, a plurality of resistors connected in parallel, where the switches 432 may connect or disconnect particular resistors 431 to the source electrodes of the NMOS transistors, thereby allowing the resistance between the source electrodes of the NMOS transistors to be varied in accordance with the setting of the switches. As such, by selecting different combinations of resistors 431, the equalizer circuit 400 can be programmed or configured to various equalization settings. As shown in FIG. 4, in a manner similar to that of the equalizer shown in FIG. 2, the various components of the main stage 410 of the equalizer circuit 400 result in a parasitic capacitance, as represented by parasitic capacitors Cpar connected to the degeneration nodes of the first NMOS transistor 401 and the second NMOS transistor 402.

The output of the equalizer circuit 400 (the equalizer output) is read from the drain electrodes of the main stage transistors as a pair of signals—a main stage negative output signal Vout− (or voutm) and a main stage positive output signal Vout+ (or voutp).

In order to counteract the effect of the parasitic capacitance, the output of the replica gm cell or replica stage 450 (the replica stage output) is connected to the output of the equalizer circuit 400 in an opposite direction from the output of the main stage 410 (the main stage output) such that the replica stage 450 cancels out the unwanted peaking in the signal from main stage 410. In the example shown in FIG. 4, a replica stage positive output Voutr+ is connected to the main stage negative output Vout− and a replica stage negative output Vout− is connected to the main stage positive output Vout+. The replica stage 450 includes a plurality of circuit elements that are substantially identical to corresponding circuit elements of the main stage 410, including a replica stage differential pair including a first NMOS transistor 451 and a second NMOS transistor 452, a first current source 461, a second current source 462, and a replica stage degeneration resistance 480 including resistors 481 and switches 482, where the switches 482 are permanently disconnected (e.g., permanently open). For example, in a manner similar to that described above, the dimensions and shapes of the circuit elements of the replica stage are substantially the same as those of the corresponding circuit elements of the main stage 410 and in substantially the same relative positions such that the parasitic capacitance of the replica stage 450 is substantially the same as that of the main stage 410.

More specifically, as shown in FIG. 4, the source electrode of the first NMOS transistor 451 supplied with the non-inverting equalizer input Vin+ of the replica stage 450 is connected to the source electrode of the second NMOS transistor 402 supplied with the inverting equalizer input Vin− of the main stage 410 in order to generate the positive output signal Vout+ of the equalizer circuit 400. Likewise, as shown in FIG. 4, the source electrode of the second NMOS transistor 452 supplied with the negative input Vin− of the replica stage 450 is connected to the source electrode of the first NMOS transistor 401 supplied with the positive input Vin+ of the main stage 410 in order to generate the negative output signal Vout− of the equalizer circuit 400. As a result, the high frequency current flowing in the replica is subtracted from the current of the main amp leading to high frequency cancellation. This high frequency current is a strong function of the parasitic capacitance in the degeneration node. In addition, because there is no degeneration resistance in the replica (e.g., the switch or switches 482 are permanently open such that the resistor or resistors 481 of the replica stage degeneration resistance 480 are permanently disconnected from the replica stage 450), there is no DC gain cancellation (e.g., no reduction in the gain of the overall equalizer circuit 400 for low frequency signals).

As noted above, an equalizer circuit may be implemented at the transmitter or transmit side and/or at the receiver or receive side of a communication channel. For example, in the case of an equalizer circuit implemented on the transmit side of the communication channel, the equalizer output would be connected to a differential pair of the communication channel (e.g., possibly through additional analog amplifier stages) through which the transmitter transmits data signals. In the case of an equalizer implemented in an integrated circuit on the receive side of the communication channel, the equalizer input would be connected to a differential pair of the communication channel (e.g., possibly through additional analog amplifier stages) through a receive port of the integrated circuit through which the integrated circuit receives data signals. The integrated circuit may be a communications integrated circuit that includes additional functionality, such as analog amplifier stages, a digital-to-analog converter (DAC), an analog-to-digital converter (ADC), an encoder, a decoder, and the like.

Figure 5:
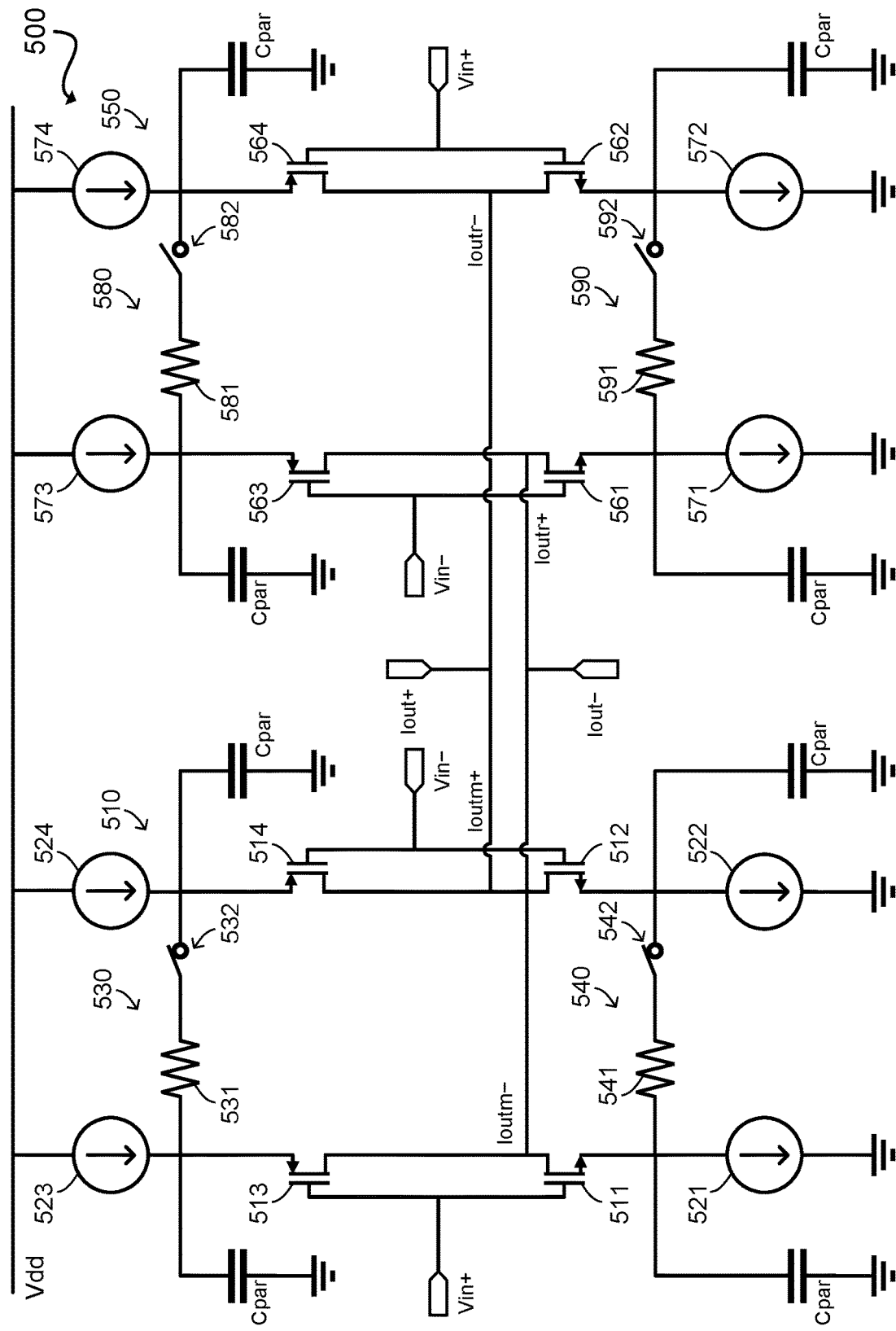
FIG. 5 illustrates an equalizer circuit according to one example of the present disclosure.

FIG. 5 illustrates an equalizer circuit 500 according to one example of the present disclosure. In more detail, the main stage 510 and the replica stage 550 of the equalizer circuit 500 of FIG. 5 have the form of a complementary metal oxide semiconductor (CMOS) differential amplifier. For example, compared to the equalizer circuit 400 shown in FIG. 4 where the non-inverting input Vin+ and the inverting input Vin− are supplied to gate electrodes of NMOS transistors 401, 402, 451, and 452, the inputs to the equalizer circuit 500 of FIG. 5, including the non-inverting input Vin+ and the inverting input Vin−, are supplied to the gate electrodes of both NMOS transistors and PMOS transistors.

In more detail, in the example shown in FIG. 5, the non-inverting input Vin+ is connected to both a first NMOS transistor 511 and a first PMOS transistor 513 of the main stage 510, where the first PMOS transistor 513 is complementary to the first NMOS transistor 511. Likewise, the inverting input Vin− is connected to both a second NMOS transistor 512 and a second PMOS transistor 514 of the main stage 510, where the second PMOS transistor 514 is complementary to the second NMOS transistor 512. The first NMOS transistor 511 and the second NMOS transistor 512 form a main stage differential pair (e.g., a first main stage differential pair) and the first PMOS transistor 513 and second PMOS transistor 514 form a second main stage differential pair, where the transistor parameters of the transistors of a differential pair are controlled to be substantially the same. A first current source 521 is connected to the source electrode of the first NMOS transistor 511, a second current source 522 is connected to the source electrode of the second NMOS transistor 512, a third current source 523 is connected to the source electrode of the first PMOS transistor 513, and a fourth current source 524 is connected to the source electrode of the second PMOS transistor 514. A first main stage degeneration resistance 530 (represented by a resistor 531 and a switch 532) and a second main stage degeneration resistance 540 (represented by a resistor 541 and a switch 542) control the gain of the main stage 510 (e.g., individual resistors of the resistor bank 540 can be connected or disconnected to program the resistor bank 540 to provide a particular resistance, which sets the gain of the main stage 510 of the equalizer circuit 500). The main stage 510 exhibits parasitic capacitance, as illustrated by four parasitic capacitances Cpar. A first output of the main stage 510 is taken from a point between the drain electrode of the first NMOS transistor 511 and the drain electrode of the first PMOS transistor 513 and a second output of the main stage 510 is taken from a point between the drain electrode of the second NMOS transistor 512 and the drain electrode of the second PMOS transistor 514.

The parasitic capacitance of the main stage 510 results in unwanted peaking in the frequency response, such that the current output Iout+ and Iout− of the main stage 510, acting alone, cannot be programmed to have a flat frequency response (e.g., higher frequencies will be boosted more than low frequencies). To address the unwanted peaking, the equalizer circuit 500 according to one example of the present disclosure includes a replica stage 550 that has its outputs connected to the main stage positive output Iout+ and the main stage negative output Iout− of the main stage 510 in a direction opposite that of the main stage 510 such that the replica stage 550 cancels out the unwanted peaking and the output of the equalizer circuit 500 as a whole (including both the main stage 510 and the replica stage 550) can be configured to generate an output with the unwanted peaking arising from the parasitic capacitance Cpar canceled out or reduced. In particular, a replica stage negative output current Ioutr− is connected to main stage positive output Iout+ and a replica stage positive output current Ioutr+ is connected to the main stage negative output Iout−. The replica stage 550 includes a plurality of circuit elements that are substantially identical to corresponding circuit elements of the main stage 510, including a replica stage differential pair including a first NMOS transistor 561 and a second NMOS transistor 562, a replica stage second differential pair including a first PMOS transistor 563 and a second PMOS transistor 564, a first current source 571, a second current source 572, a third current source 573, a fourth current source 574, a permanently disconnected first replica stage degeneration resistance 580 (represented by a resistor 581 and a permanently open switch 582), and a permanently disconnected second replica stage degeneration resistance 590 (represented by a resistor 591 and a permanently open switch 592). For example, in a manner similar to that described above, the dimensions and shapes of the circuit elements of the replica stage are substantially the same as those of the corresponding circuit elements of the main stage 510 and in substantially the same relative positions such that the parasitic capacitance of the replica stage 550 is substantially the same as that of the main stage 510.

In more detail, in the example shown in FIG. 5, the non-inverting input Vin+ is connected to both a first NMOS transistor 561 and a first PMOS transistor 563 of the replica stage 550, where the first PMOS transistor 563 is complementary to the first NMOS transistor 561. Likewise, the inverting input Vin− is connected to both a second NMOS transistor 562 and a second PMOS transistor 564 of the replica stage 550, where the second PMOS transistor 564 is complementary to the second NMOS transistor 562. A first current source 571 is connected to the source electrode of the first NMOS transistor 561, a second current source 572 is connected to the source electrode of the second NMOS transistor 562, a third current source 573 is connected to the source electrode of the first PMOS transistor 563, and a fourth current source 574 is connected to the source electrode of the second PMOS transistor 564. First replica stage degeneration resistance 580 and second replica stage degeneration resistance 590 set the gain of the replica stage 550 are disconnected such that the gain of the replica stage matches the gain of the main stage when the resistors are disconnected. The replica stage 550 also exhibits parasitic capacitance, as illustrated by four parasitic capacitances Cpar and, in a manner similar to that described above, the first replica stage degeneration resistance 580 and the second replica stage degeneration resistance 590 are included in order for the parasitic capacitance arising from the resistor bank to appear in the replica stage 550, such that the parasitic capacitance of the replica stage 550 matches (e.g., is substantially the same as) the parasitic capacitance of the main stage 510.

A node between the drain electrode of the first NMOS transistor 561 and the drain electrode of the first PMOS transistor 563 of the replica stage 550 is connected to a node between the drain electrode of the first NMOS transistor 511 and the drain electrode of the first PMOS transistor 513 of the main stage 510 such that the replica stage 550 cancels or reduced unwanted peaking in the first output Iout− of the equalizer circuit 500. Similarly, a node between the drain electrode of the second NMOS transistor 562 and the drain electrode of the second PMOS transistor 564 of the replica stage 550 is connected to a node between the drain electrode of the second NMOS transistor 512 and the drain electrode of the second PMOS transistor 514 of the main stage 510 such that the replica stage 550 cancels or reduced unwanted peaking in the second output Iout+ of the equalizer circuit 500.

As noted above, an equalizer circuit may be implemented at the transmitter or transmit side and/or at the receiver or receive side of a communication channel. For example, in the case of an equalizer circuit implemented in an integrated circuit on the transmit side of the communication channel, the equalizer output would be connected to a differential pair of the communication channel (e.g., possibly through additional analog amplifier stages) through a transmit port of the integrated circuit through which the integrated circuit transmits data signals. In the case of an equalizer implemented in an integrated circuit on the receive side of the communication channel, the equalizer input would be connected to a differential pair of the communication channel (e.g., possibly through additional analog amplifier stages) through a receive port of the integrated circuit through which the integrated circuit receives data signals. The integrated circuit may be a communications integrated circuit that includes additional functionality, such as analog amplifier stages, a digital-to-analog converter (DAC), an analog-to-digital converter (ADC), an encoder, a decoder, and the like.

The equalizer circuit 500 of FIG. 5 presents another example of an equalizer circuit according to the present disclosure that includes both a main stage and a replica stage, where the replica stage cancels or reduces unwanted peaking arising from parasitic capacitance in the main stage.

Accordingly, aspects of the present disclosure relate to equalizer circuits that include replica stage circuits configured to cancel out or reduce unwanted peaking in the frequency-dependent boost or gain in a main stage circuit. In some circumstances, the unwanted peaking arises, at least in part, due to parasitic capacitance present in the main stage circuit.

Figure 6:
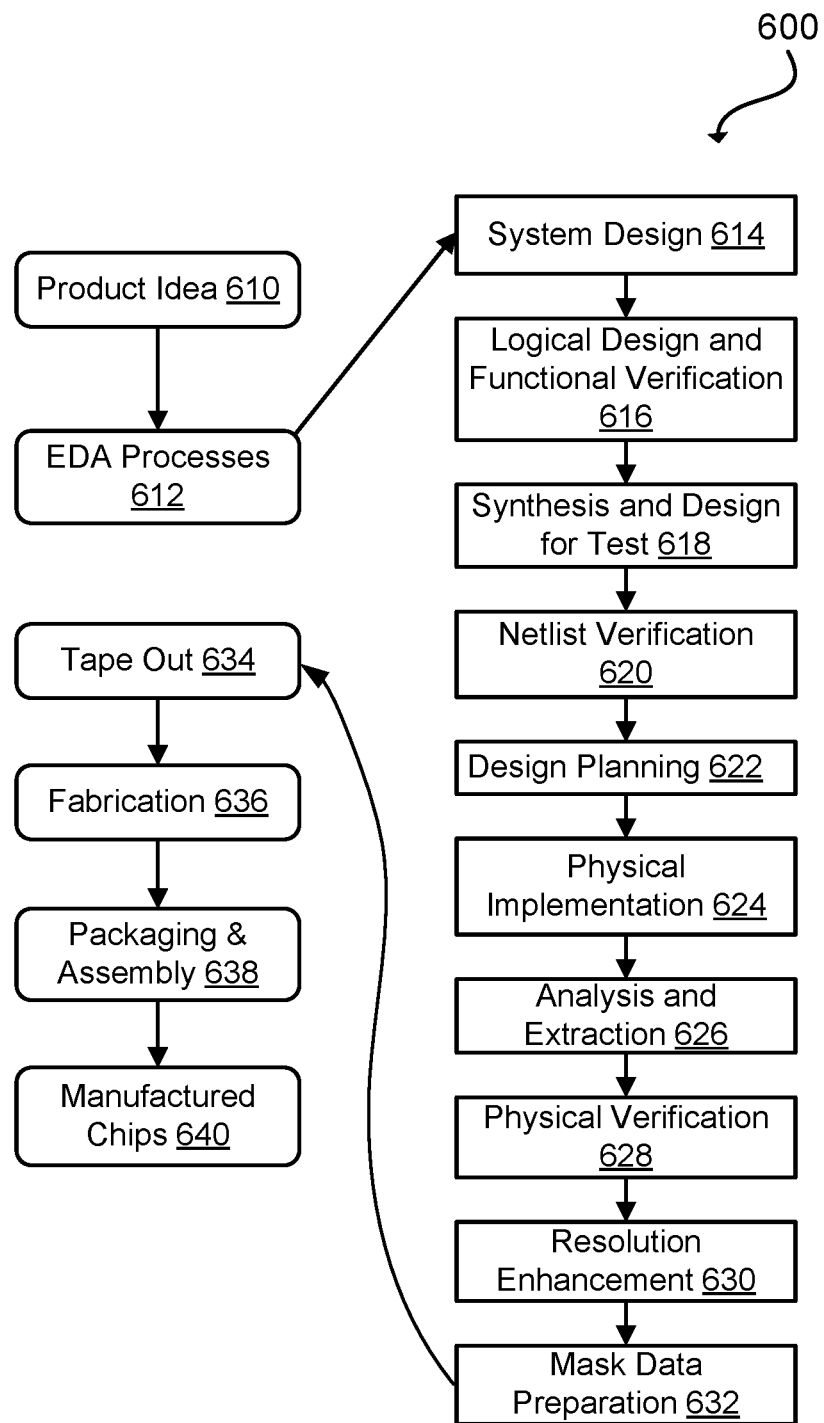
FIG. 6 depicts a flowchart of various processes used during the design and manufacture of an integrated circuit in accordance with some embodiments of the present disclosure.

FIG. 6 illustrates an example set of processes 600 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 610 with information supplied by a designer, information which is transformed to create an article of manufacture that uses a set of EDA processes 612. When the design is finalized, the design is taped-out 634, which is when artwork (e.g., geometric patterns) for the integrated circuit is sent to a fabrication facility to manufacture the mask set, which is then used to manufacture the integrated circuit. After tape-out, a semiconductor die is fabricated 636 and packaging and assembly processes 638 are performed to produce the finished integrated circuit 640.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 6. The processes described by be enabled by EDA products (or EDA systems).

During system design 614, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 616, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 618, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 620, the netlist is checked for compliance with timing constraints and for correspondence with the HDL code. During design planning 622, an overall floor plan for the integrated circuit is constructed and analyzed for timing and top-level routing.

During layout or physical implementation 624, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

A computer-readable design of an equalizer circuit according to the present disclosure may be included within a library of available pre-designed cells or circuit blocks or circuit portions stored on a computer-readable medium (e.g., in a digital representation of an equalizer circuit). This allows the design of an equalizer circuit according to the present disclosure to be placed as a circuit block within a design of an integrated circuit (e.g., a digital representation of the integrated circuit). For example, an equalizer circuit specified by the computer-readable design may be incorporated into the design of an analog or mixed-signal integrated circuit for communications (e.g., an integrated circuit for network communications such as Ethernet, having a plurality of ports corresponding to differential pairs, such as an input or receive differential pair and an output or transmit differential pair).

During analysis and extraction 626, the circuit function is verified at the layout level, which permits refinement of the layout design. During physical verification 628, the layout design is checked to ensure that manufacturing constraints are correct, such as DRC constraints, electrical constraints, lithographic constraints, and that circuitry function matches the HDL design specification. During resolution enhancement 630, the geometry of the layout is transformed to improve how the circuit design is manufactured.

During tape-out, data is created to be used (after lithographic enhancements are applied if appropriate) for production of lithography masks. During mask data preparation 632, the 'tape-out' data is used to produce lithography masks that are used to produce finished integrated circuits.

A storage subsystem of a computer system (such as computer system 700 of FIG. 7) may be used to store the programs and data structures that are used by some or all of the EDA products described herein, and products used for development of cells for the library and for physical and logical design that use the library.

Figure 7:
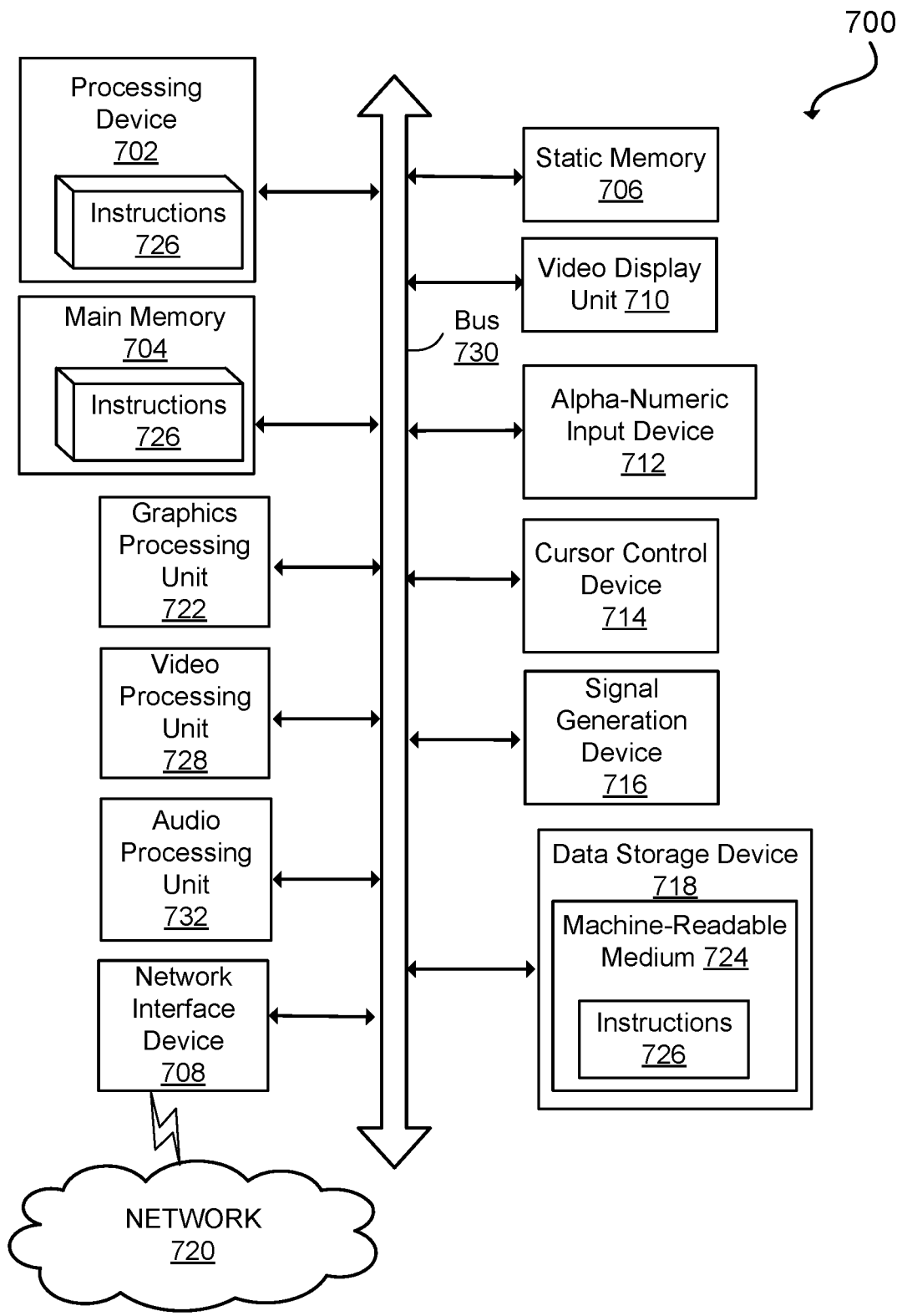
FIG. 7 depicts a diagram of an example computer system in which embodiments of the present disclosure may operate.

FIG. 7 illustrates an example machine of a computer system 700 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM), a static memory 706 (e.g., flash memory, static random access memory (SRAM), etc.), and a data storage device 718, which communicate with each other via a bus 730.

Processing device 702 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 may also be one or more special-purpose processing devices such as an application specific integrated circuit (ASIC), a field programmable gate array (FPGA), a digital signal processor (DSP), network processor, or the like. The processing device 702 may be configured to execute instructions 726 for performing the operations and steps described herein.

The computer system 700 may further include a network interface device 708 to communicate over the network 720. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), a graphics processing unit 722, a signal generation device 716 (e.g., a speaker), graphics processing unit 722, video processing unit 728, and audio processing unit 732.

The data storage device 718 may include a machine-readable storage medium 724 (also known as a non-transitory computer-readable medium) on which is stored one or more sets of instructions 726 or software embodying any one or more of the methodologies or functions described herein. The instructions 726 may also reside, completely or at least partially, within the main memory 704 and/or within the processing device 702 during execution thereof by the computer system 700, the main memory 704 and the processing device 702 also constituting machine-readable storage media.

In some implementations, the instructions 726 include instructions to implement functionality corresponding to the present disclosure. While the machine-readable storage medium 724 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 702 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. An equalizer circuit comprising:
    a main stage circuit comprising:
        a main stage differential pair comprising a first transistor and a second transistor; and
        a main stage degeneration resistance connected between a source electrode of the first transistor and a source electrode of the second transistor;
    a replica stage circuit comprising:
        a replica stage differential pair comprising a third transistor and a fourth transistor, the replica stage differential pair matching the main stage differential pair; and
        a replica stage degeneration resistance matching the main stage degeneration resistance and permanently disconnected from at least one transistor of the replica stage differential pair;
    a plurality of equalizer inputs connected to:
        a plurality of gate electrodes of the main stage differential pair; and
        a plurality of gate electrodes of the replica stage differential pair; and
    a plurality of equalizer outputs connected to:
        a plurality of main stage outputs, comprising a main stage positive output and a main stage negative output, connected to a plurality of drain electrodes of the main stage differential pair; and
        a plurality of replica stage outputs, comprising a replica stage positive output and a replica stage negative output, connected to a plurality of drain electrodes of the replica stage differential pair, the replica stage positive output being connected to the main stage negative output and the replica stage negative output being connected to the main stage positive output.

2. The equalizer circuit of claim 1, wherein the plurality of equalizer inputs comprises:
    a first equalizer input connected to:
        a gate electrode of the first transistor of the main stage differential pair; and
        a gate electrode of the fourth transistor of the replica stage differential pair; and
    a second equalizer input connected to:
        a gate electrode of the second transistor of the main stage differential pair; and
        a gate electrode of the third transistor of the replica stage differential pair.

3. The equalizer circuit of claim 1, wherein the plurality of equalizer outputs comprises:
    a first equalizer output connected to:
        a drain electrode of the first transistor of the main stage differential pair at the main stage positive output; and
        a drain electrode of the fourth transistor of the replica stage differential pair at the replica stage negative output; and
    a second equalizer output connected to:
        a drain electrode of the second transistor of the main stage differential pair at the main stage negative output; and
        a drain electrode of the third transistor of the replica stage differential pair at the replica stage positive output.

4. The equalizer circuit of claim 1, wherein the equalizer circuit has a configurable boost over a range of boost values, the range of boost values having a minimum value of 0 dB.

5. The equalizer circuit of claim 4,
    wherein the main stage degeneration resistance comprises a main stage resistor bank comprising a plurality of resistors and a plurality of switches, and
    wherein the replica stage degeneration resistance comprises a replica stage resistor bank comprising a plurality of resistors and a plurality of permanently disconnected switches.

6. The equalizer circuit of claim 4,
    wherein the main stage circuit further comprises a main stage capacitor bank comprising a plurality of capacitors and a plurality of switches, and
    wherein the replica stage circuit further comprises a replica stage capacitor bank comprising a plurality of capacitors and a plurality of permanently disconnected switches.

7. The equalizer circuit of claim 1, wherein the first transistor and the second transistor of the main stage differential pair are negative-type metal oxide semiconductor (NMOS) transistors, and
    wherein the third transistor and the fourth transistor of the replica stage differential pair are NMOS transistors.

8. The equalizer circuit of claim 1,
    wherein the main stage circuit further comprises:
        a second main stage differential pair comprising a first positive-type metal oxide semiconductor (PMOS) transistor and a second PMOS transistor connected between the main stage differential pair and a voltage source, and
    wherein the replica stage circuit further comprises:
        a second replica stage differential pair comprising a first PMOS transistor and a second PMOS transistor connected between the replica stage differential pair and the voltage source.

9. A communications integrated circuit comprising:
    an equalizer circuit connected to a port of the communications integrated circuit, the equalizer circuit comprising:
        a main stage circuit comprising:
            a main stage differential pair comprising a first transistor and a second transistor; and
            a main stage degeneration resistance connected between a source electrode of the first transistor and a source electrode of the second transistor;
        a replica stage circuit comprising: a replica stage differential pair comprising a third transistor and a fourth transistor, the replica stage differential pair matching the main stage differential pair, the replica stage circuit having a parasitic capacitance matching a parasitic capacitance of the main stage circuit, the parasitic capacitance of the main stage circuit comprising a parasitic capacitance of the main stage degeneration resistance;

a plurality of equalizer inputs connected to:
  a plurality of gate electrodes of the main stage differential pair; and
  a plurality of gate electrodes of the replica stage differential pair; and
a plurality of equalizer outputs connected to:
  a plurality of main stage outputs, comprising a main stage positive output and a main stage negative output, connected to a plurality of drain electrodes of the main stage differential pair; and
  a plurality of replica stage outputs, comprising a replica stage positive output and a replica stage negative output, connected to a plurality of drain electrodes of the replica stage differential pair, the replica stage positive output being connected to the main stage negative output and the replica stage negative output being connected to the main stage positive output.

10. The communications integrated circuit of claim 9, wherein the port of the communications integrated circuit is a receive port connected to the plurality of equalizer inputs.

11. The communications integrated circuit of claim 10, wherein the plurality of equalizer inputs comprises:
  a first equalizer input connected to:
    a gate electrode of the first transistor of the main stage differential pair; and
    a gate electrode of the fourth transistor of the replica stage differential pair; and
  a second equalizer input connected to:
    a gate electrode of the second transistor of the main stage differential pair; and
    a gate electrode of the third transistor of the replica stage differential pair.

12. The communications integrated circuit of claim 9, wherein the port of the communications integrated circuit is a transmit port connected to the plurality of equalizer outputs.

13. The communications integrated circuit of claim 12, wherein the plurality of equalizer outputs comprises:
  a first equalizer output connected to:
    a drain electrode of the first transistor of the main stage differential pair at the main stage positive output; and
    a drain electrode of the fourth transistor of the replica stage differential pair at the replica stage negative output; and
  a second equalizer output connected to:
    a drain electrode of the second transistor of the main stage differential pair at the main stage negative output; and
    a drain electrode of the third transistor of the replica stage differential pair at the replica stage positive output.

14. The communications integrated circuit of claim 9, wherein the equalizer circuit has a configurable boost over a range of boost values, the range of boost values having a minimum value of 0 dB.

15. The communications integrated circuit of claim 14,
  wherein the main stage degeneration resistance comprises a main stage resistor bank comprising a plurality of resistors and a plurality of switches, and
  wherein the replica stage circuit comprises a replica stage degeneration resistance comprising a replica stage resistor bank comprising a plurality of resistors and a plurality of permanently disconnected switches.

16. A non-transitory computer-readable medium comprising stored instructions, which when executed by a processor, cause the processor to generate a digital representation of an integrated circuit comprising:
  a main stage circuit including:
    a main stage differential pair comprising a first transistor and a second transistor; and
    a main stage degeneration resistance connected between a source electrode of the first transistor and a source electrode of the second transistor;
  a replica stage circuit including:
    a replica stage differential pair comprising a third transistor and a fourth transistor, the replica stage differential pair matching the main stage differential pair; and
    a replica stage degeneration resistance matching the main stage degeneration resistance and permanently disconnected from at least one transistor of the replica stage differential pair;
  a plurality of equalizer inputs connected to:
    a plurality of gate electrodes of the main stage differential pair; and
    a plurality of gate electrodes of the replica stage differential pair; and
  a plurality of equalizer outputs connected to:
    a plurality of main stage outputs, comprising a main stage positive output and a main stage negative output, connected to a plurality of drain electrodes of the main stage differential pair; and
    a plurality of replica stage outputs, comprising a replica stage positive output and a replica stage negative output, connected to a plurality of drain electrodes of the replica stage differential pair, the replica stage positive output being connected to the main stage negative output and the replica stage negative output being connected to the main stage positive output.

17. The non-transitory computer-readable medium of claim 16, wherein the main stage circuit has a configurable boost over a range of boost values, the range of boost values having a minimum value of 0 dB.

18. The non-transitory computer-readable medium of claim 17,
  wherein the main stage degeneration resistance comprises a main stage resistor bank comprising a plurality of resistors and a plurality of switches, and
  wherein the replica stage degeneration resistance comprises a replica stage resistor bank comprising a plurality of resistors and a plurality of permanently disconnected switches.

19. The non-transitory computer-readable medium of claim 17,
  wherein the main stage circuit further comprises a main stage capacitor bank comprising a plurality of capacitors and a plurality of switches, and
  wherein the replica stage circuit further comprises a replica stage capacitor bank comprising a plurality of capacitors and a plurality of permanently disconnected switches.

20. The non-transitory computer-readable medium of claim 16,
  wherein the first transistor and the second transistor of the main stage differential pair and the third transistor and the fourth transistor of the replica stage differential pair are negative-type metal oxide semiconductor (NMOS) transistors, and wherein the main stage circuit further comprises:
   a second main stage differential pair comprising a first positive-type metal oxide semiconductor (PMOS) transistor and a second PMOS transistor connected between the main stage differential pair and a voltage source, and
wherein the replica stage circuit further comprises:
   a second replica stage differential pair comprising a third PMOS transistor and a fourth PMOS transistor connected between the replica stage differential pair and the voltage source.

* * * * *